United States Patent
Chiba et al.

(10) Patent No.: US 7,863,802 B2
(45) Date of Patent: Jan. 4, 2011

(54) QUARTZ CRYSTAL ELEMENT MADE OF DOUBLE-ROTATION Y-CUT QUARTZ CRYSTAL PLATE

(75) Inventors: Akio Chiba, Saitama (JP); Shigeru Obara, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 250 days.

(21) Appl. No.: 12/254,079

(22) Filed: Oct. 20, 2008

(65) Prior Publication Data

US 2009/0102326 A1    Apr. 23, 2009

(30) Foreign Application Priority Data

Oct. 18, 2007   (JP)   ............... 2007-271675

(51) Int. Cl.
   H01L 41/08   (2006.01)
   H01L 41/18   (2006.01)
   H03H 9/21    (2006.01)

(52) U.S. Cl. ............... 310/361; 310/367; 310/360

(58) Field of Classification Search ......... 310/360–361, 310/367
See application file for complete search history.

(56) References Cited

U.S. PATENT DOCUMENTS

| | | | | |
|---|---|---|---|---|
| 2,261,791 A | * | 11/1941 | Bokovoy | 310/361 |
| 4,188,557 A | * | 2/1980 | Mattuschka | 310/368 |
| 4,211,947 A | * | 7/1980 | Ikeno et al. | 310/360 |
| 4,355,257 A | * | 10/1982 | Kawashima et al. | 310/361 |
| 4,375,604 A | * | 3/1983 | Vig | 310/361 |
| 4,381,471 A | * | 4/1983 | Filler et al. | 310/361 |
| 4,568,850 A | * | 2/1986 | Ballato | 310/361 |
| 4,926,086 A | * | 5/1990 | Bourgeois et al. | 310/361 |
| 6,744,182 B2 | * | 6/2004 | Branham | 310/361 |
| 7,011,887 B2 | | 3/2006 | Obara et al. | |
| 7,157,983 B2 | * | 1/2007 | Tanaka | 310/361 |
| 7,705,524 B2 | * | 4/2010 | Onoe et al. | 310/361 |
| 2010/0148782 A1 | * | 6/2010 | Matsumoto | 310/348 |

FOREIGN PATENT DOCUMENTS

JP   4-138708   5/1992
JP   2000-40937   2/2000

* cited by examiner

Primary Examiner—J. SanMartin
(74) Attorney, Agent, or Firm—Cantor Colburn LLP

(57) ABSTRACT

A crystal element has a crystal blank which is cut from a crystal of quartz and has a principal plane orthogonal to a Y"-axis, where the Y- and Z-axes are rotated by an angle of α around the X-axis in the crystal to be designated as the Y'- and Z'-axes, and the X- and Y'-axes are rotated by an angle of β around the Z'-axis to be designated as the X'- and Y"-axes. The crystal blank has mutually orthogonal two null stress-sensitivity axes. In the crystal blank, the thickness of the center part at which two null stress-sensitivity axes intersect is increased, and a ridge line portion defining a quadrangular pyramid like shape from the center part toward the outer peripheral part is formed. The sectional thickness of the crystal blank along the base thereof is larger in the central region and becomes gradually smaller toward both ends.

10 Claims, 11 Drawing Sheets

QUARTZ CRYSTAL ELEMENT MADE OF DOUBLE-ROTATION Y-CUT QUARTZ CRYSTAL PLATE

BACKGROUND OF THE INVENTION

1. Field of the Invention

The present invention relates to a quartz crystal element made of a double-rotation Y-cut quartz crystal plate represented by an SC-cut plate, IT-cut plate and the like, particularly to a quartz crystal element which has stable vibration characteristics and which is easy to design and coordinate.

2. Description of the Related Arts

Quartz crystal elements which are used as a reference source of frequency and time are classified into several "cuts" according to the crystallographic orientation in which a vibration plate, that is, a quartz crystal blank, constituting a crystal element is cut out from a single crystal of quartz. Until now, for example, an X-cut, AT-cut, BT-cut and the like are known as such types of cuts.

In quartz, three crystal axes: an X-, Y-, and Z-axes are crystallographically defined. A crystal element having a crystal blank which is cut out from a crystal of quartz along a plane which is defined by: rotating a plane perpendicular to one of the three crystal axes of quartz by a predetermined angle centering around one of the remaining two crystal axes, and further rotating the plane by another predetermined angle from the rotated position centering around the last crystal axis, is called a double-rotation crystal element. For example, a crystal element having a crystal blank which is cut out from a crystal of quartz along a plane which is obtained by successively rotating a plane orthogonal to Y-axis centering around each of the remaining crystal axes respectively, is called a crystal element made of a double-rotation Y-cut plate. Since a plate of quartz crystal made of a plane parallel with the Y-axis is called a Y-cut plate, a double-rotation Y-cut plate is a plate of quartz crystal having a cutting orientation defined by successively rotating a Y-cut plate around the X-axis and the Z-axis. As an example of the crystal element made of a double-rotation Y-cut plate, there is known a crystal element of SC-cut such as disclosed in, for example, Japanese Patent Laid-Open Nos. 4-138708 and 2000-40937 (JP-A-4-138708 and JP-A-2000-040937).

An SC-cut crystal element is particularly superior in stress sensitivity characteristics and thermal shock resistance in its quartz crystal blank, and therefore is used in a high-stability quartz crystal oscillator for wireless base stations, which among telecommunication apparatuses are required to exhibit smaller frequency deviation against the variation of various conditions. However, an SC-cut crystal element has a problem in that the design and manufacturing thereof is not easy because its crystal blank has a cutting orientation obtained by rotating twice the inherent crystal axes of quartz.

FIGS. 1A and 1B illustrate the cutting orientation of an SC-cut crystal blank, and FIG. 2 shows the relationship between an SC-cut crystal blank cut out from a crystal of quartz and the crystal axes of the quartz.

The cutting orientation of an ST-cut crystal blank from a crystal of quartz will be described. As shown in FIG. 1A, a plane orthogonal to a Y-axis of a crystal of quartz is rotated by an angle of α centering around an X-axis from the Y-axis toward a Z-axis, that is, as a counterclockwise rotation. As a result of this rotation, the Y-axis and the Z-axis change to a Y'-axis and a Z'-axis, respectively. Next, this plane is rotated by an angle of β centering around the Z'-axis as a rotation from the X-axis toward the Y'-axis, that is, a counterclockwise rotation. As a result of this rotation, the X-axis and the Y'-axis change to an X'-axis and a Y"-axis, respectively. Thus, a crystal blank which is cut out from a crystal of quartz along a plane which is obtained by subjecting a Y-cut plate to the two rotation operations, is an SC-cut crystal blank. It is noted that even if the order of the two rotation operations is reversed, that is, when firstly rotated by an angle of β around the Z-axis and thereafter rotated by an angle of α around the new X'-axis, the same result will be obtained.

In short, as shown in FIG. 2, when the Y-axis and the Z-axis are rotated by an angle of α centering around the crystallographic X-axis of quartz, and further the X-axis and the Y'-axis are rotated by an angle of β degree centering around the Z'-axis to create new crystal axes, that is, an X'-axis, a Y"-axis, and a Z'-axis by such rotations, a quartz crystal plate which is cut with its principal plane being orthogonal to the Y"-axis is called a double-rotation Y-cut plate. In this case, the principal plane of crystal blank 1 which is to be cut out is a plane defined by the X'-axis and the Z'-axis, and the thickness direction of crystal blank 1 is parallel with the Y"-axis.

An SC-cut crystal blank is one in which the reference angles of rotational angles are set as 33 degrees for α and 22 degrees for β in such a double-rotation Y-cut plate. Where, the reference angle is an angle which provides a reference of cutting orientation when a crystal blank is designed and a value near the reference value is appropriately selected depending on the desired temperature characteristics and the like of the crystal blank when the crystal blank is actually cut out.

Supposing that crystal blank 1 made of an SC-cut quartz plate is thus obtained, a circular excitation electrode for exciting thickness-shear vibration in crystal blank 1 is formed in the central region of each of the principal planes of crystal blank 1 as shown in FIGS. 3A and 3B, and thus an SC-cut crystal element is obtained. Thickness-shear vibration in quartz has a resonance frequency corresponding to the thickness of crystal blank 1; the resonance frequency increases as the thickness of crystal blank 1 decreases. In order to electrically connect the crystal element to an external circuit, leader electrode 3 described below extends from each of excitation electrode 2 toward the outer peripheral part of crystal blank 1 as shown in FIG. 4. Then, the crystal blank is held electrically and mechanically at the position where leader electrodes 3 extend, and the crystal blank is hermetically encapsulated into a package with the state in which the crystal blank is held in this manner thereby completing a crystal unit.

In such a crystal element, there is null stress-sensitivity axis Z'(γ), which is the axis obtained by rotating the Z'-axis by an angle of γ toward the X'-axis, that is, in a counterclockwise direction, depending on the crystal structure in the SC-cut plate which is a double-rotation Y-cut plate, and further there is another null stress-sensitivity axis X'(γ) which is the axis perpendicular to null stress-sensitivity axis Z'(γ), that is, the axis obtained by rotating the X'-axis by an angle of γ. A null stress-sensitivity axis refers to the axis of which frequency variation becomes minimum including the case of zero when stress is applied from both sides of crystal blank 1 along its axis. The reference angle of angle γ is about 8 degrees in an SC-cut plate.

The resonance frequency of a crystal blank varies when stress is applied thereto, and it may be changed by the stress applied from the mechanism to hold the crystal blank. Accordingly, to minimize such variation of the resonance frequency, it is preferable to hold the crystal blank at both ends of the null stress-sensitivity axis. When the planer shape of crystal blank 1 is chosen to be, for example, a square, crystal blank 1 is arranged to be cut out from a crystal of quartz such that two mutually orthogonal null stress-sensitivity axes Z'(γ) and X'(γ) become respectively a pair of diagonal lines of the square as shown in FIG. 4. Leader electrodes 3 are, for example, configured to extend from excitation electrodes 2 to both ends of the diagonal line which becomes one null stress-sensitivity axis Z'(γ). Then, by holding both ends, to which leader electrodes 3 are extended, with a mechanism (not shown), the crystal blank is electrically and mechanically held at two points. When enhancing the strength of the crystal element against mechanical impact, the crystal blank is further held at both ends of the other null stress-sensitivity axis X'(γ) such that the crystal blank is eventually held at four points. The crystal blank thus held at two or four points is hermetically encapsulated in a package as described above.

Since each four corner of crystal blank 1 is located farthest from the central region which serves as the vibration region in the crystal blank, it is possible to reduce the effect on the vibration characteristics at the central region by extending leader electrode 3 toward each corner and holding the crystal blank at the corner. Although it is also possible to configure crystal blank 1 to have a circular planar shape, since it becomes difficult to recognize the position of the null stress-sensitivity axis when a circular shape is employed, the position of the null stress-sensitivity axis becomes more recognizable thereby making the holding operation of the crystal blank to be easier when the crystal blank is configured to have a rectangular planar shape.

According to observation results of the thickness-shear vibration in an SC-cut plate, it exhibits a vibration displacement distribution in which vibration is emphasized for example in the hatched area shown in FIG. 5. That is, the central region of the crystal blank is divided into four regions shown in the FIG. by mutually orthogonal null stress-sensitivity axes Z'(γ) and X'(γ), and each divided region respectively has an emphasized vibration displacement.

The magnitudes of the vibration displacement in these four emphasized portions are approximately the same. In FIG. 5, the center of each region where vibration displacement is emphasized is shown by a solid point, and these four center points are positioned approximately at corners of a square as shown by a chain line in the figure. In other words, the direction which is along the line orthogonal to a diagonal direction of the crystal blank, and which avoids the four portions of emphasized vibration displacement, becomes the above described null stress-sensitivity axis Z'(γ) or X'(γ), since it does not affect the vibration displacement.

In an SC-cut crystal element, when the vibration frequency is relatively low, for example, no more than 20 MHz, in order to confine the vibration energy of thickness-shear vibration into a central region of the crystal blank thereby decreasing the crystal impedance (CI), one principal plane of the crystal blank is processed to be a flat plane and the other principal plane is processed to be a convex-shape, thereby forming a so called plano-convex shape.

Further, examples of the crystal element made of a double-rotation Y-cut plate include an IT-cut quartz crystal element in which the above described angles of α and β are different from those of the SC-cut crystal element, as disclosed in U.S. Pat. No. 7,001,887. In an IT-cut crystal element, the reference angle of angle α is 34 degrees and the reference angle of angle β is 19 degrees.

However, although the above described SC-cut crystal element is superior in vibration characteristics such as stress sensitivity characteristics and thermal shock property as described above, the vibration characteristics will significantly vary due to a slight difference in the angle when cutting out the crystal blank. For example, the vibration characteristics of the crystal element sensitively responds to the cutting orientation as a double-rotation Y-cut plate for forming an SC-cut plate, and the cutting angle in the plane when forming a rectangular crystal blank such that its corners are positioned at the positions inclined by 8 degrees from the Z'-axis or the X'-axis. While an SC-cut crystal element has a frequency-temperature characteristics which can be represented by a cubic curve of which inflection point is positioned at about 90° C. of temperature, this frequency-temperature characteristics will significantly vary and also the crystal impedance (CI) will degrade due to a slight error in the cutting orientation and cutting angle.

When crystal blank 1 has a shape other than a square, for example, a circular or rectangular shape, the vibration characteristics will sensitively respond to even a slight deviation of the holding position from the position inclined 8 degrees from Z'-axis or X'-axis.

When the cutting orientation or the cutting angle is thus deviated from the proper value thereof, observation results show that the vibration displacement distribution in the above described four portions in a crystal element will be changed from the proper symmetric arrangement, and becomes an asymmetric arrangement as a result of, for example as shown in FIG. 6, the position and size of the region where vibration displacement is emphasized being changed. Especially when the crystal blank is configured to have a square planar shape, it is necessary to reduce the errors in the cutting orientation and the cutting angle of the crystal blank, and therefore the design and manufacturing of the SC-cut crystal element become difficult thereby degrading the productivity thereof.

SUMMARY OF THE INVENTION

It is an object of the present invention to provide a crystal element made of a double-rotation Y-cut quartz plate which is easy to design and manufacture and of which vibration characteristics are well maintained.

The object of the present invention is achieved by a crystal element made of a double-rotation Y-cut plate, the crystal element comprising a crystal blank which is cut from a crystal of quartz, a principle plane of the crystal blank being orthogonal to a Y"-axis, where a Y-axis and a Z-axis are rotated by an angle of α centering around an X-axis in the crystal of quartz to be designated as a Y'-axis and a Z'-axis, and the X-axis and the Y'-axis are rotated by an angle of β centering around the Z'-axis to be designated as an X'-axis and the Y"-axis; wherein the crystal blank has mutually orthogonal two null stress-sensitivity axes and has emphasized vibration displacement in four regions radially divided from a center at which the null stress-sensitivity axes mutually intersect at a right angle; wherein the thickness of a center part at which the null stress-sensitivity axes mutually intersect at a right angle is increased, and a ridge line portion defining a quadrangular pyramid like shape from the center part toward an outer peripheral part of the crystal blank is formed; and wherein when a base opposing to a vertex angle of the quadrangular pyramid like shape is provided, a sectional thickness of the crystal blank along the base is larger in the central region of the crystal blank and becomes gradually smaller toward both ends of the crystal blank.

According to such configuration, the emphasized vibration displacement in the four regions between mutually orthogonal null stress-sensitivity axes is confined into each of the four thickened regions between the orthogonal null stress-sensitivity axes. Even if some deviation occurs in the cutting orientation, cutting angle, and holding position of a crystal blank which is a double-rotation Y-cut plate, the energy of the vibration displacement in the four regions is confined into those four regions, and the leakage thereof is restricted thereby preventing the mutual interference between regions having emphasized vibration displacement. Therefore, it is possible to prevent the degradation of CI due to the leakage of vibration energy and the variation of the frequency-temperature characteristics due to the mutual interference. Thus, it is made possible to obtain a crystal element made of a double-rotation Y-cut plate, which is superior in vibration characteristics and is easy to design and manufacture.

DETAILED DESCRIPTION OF THE PREFERRED EMBODIMENTS

Figure 7:
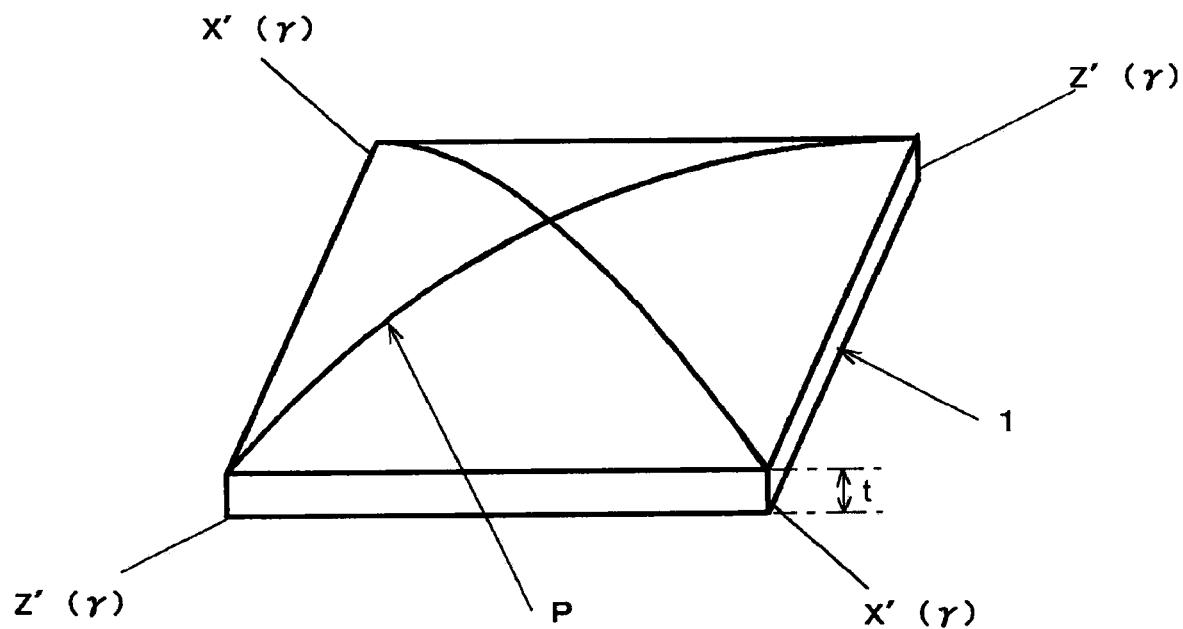
FIG. 7 is a perspective view of a crystal blank used in the SC-cut crystal element according to a first embodiment of the present invention.

FIG. 7 shows a quartz crystal element made of a double-rotation Y-cut plate according to a first embodiment of the present invention. Particularly, FIG. 7 illustrates a quartz crystal blank constituting the crystal element. Here, description will be made on the case in which the double-rotation Y-cut plate is an SC-cut quartz plate.

Figure 1A:
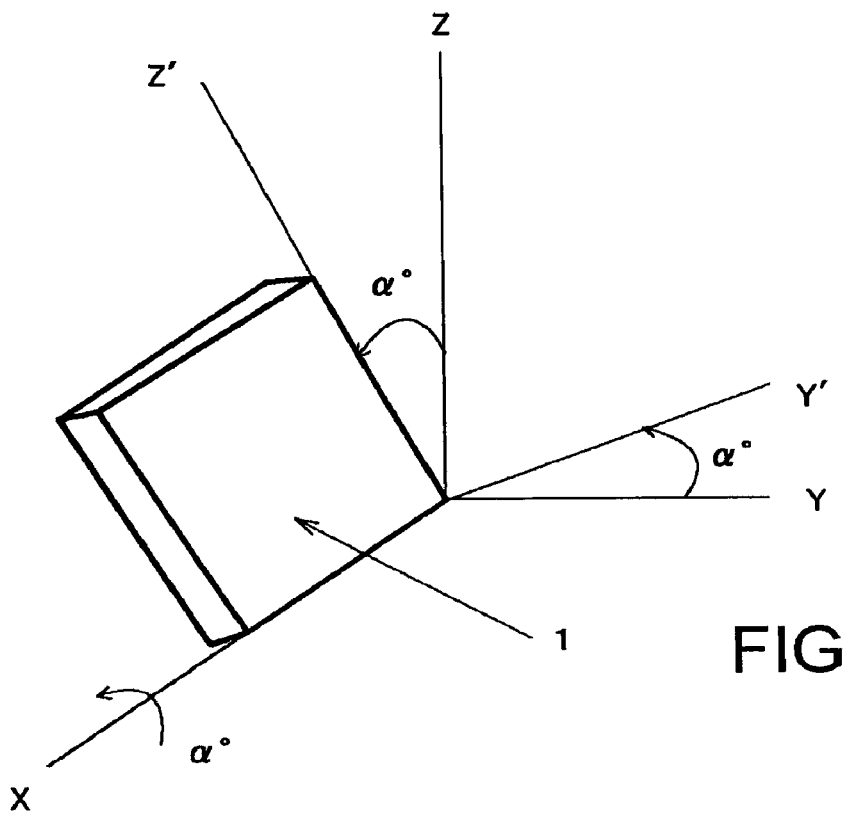
FIGS. 1A and 1B are views illustrating the cutting orientation of an SC-cut crystal blank from a crystal of quartz.
Figure 1B:
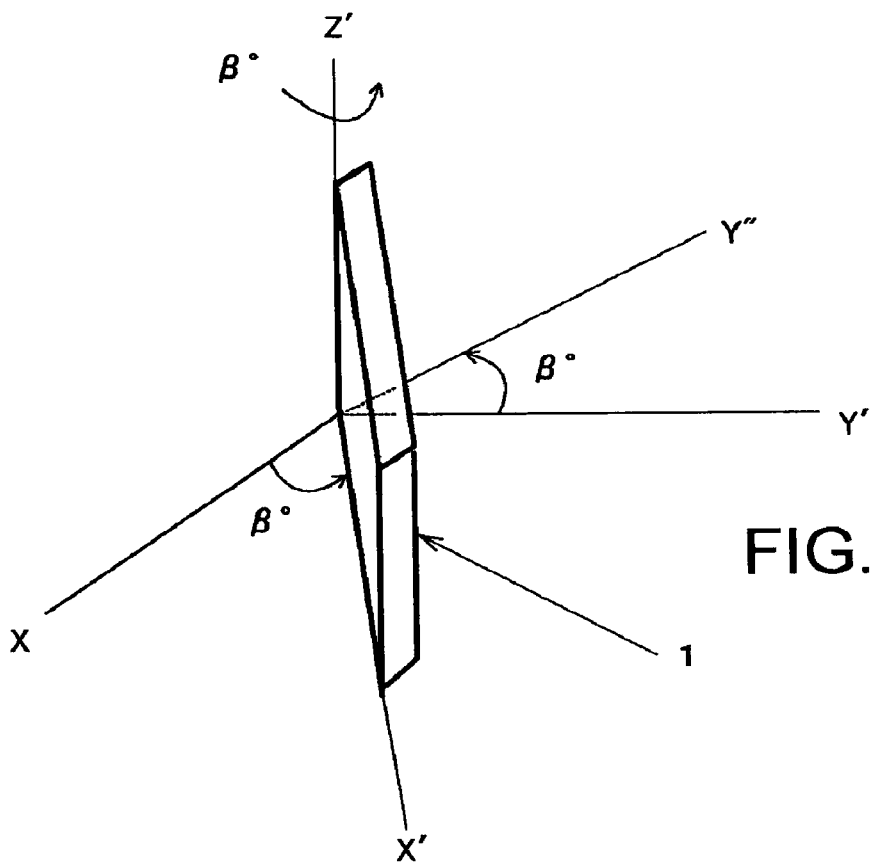
Figure 2:
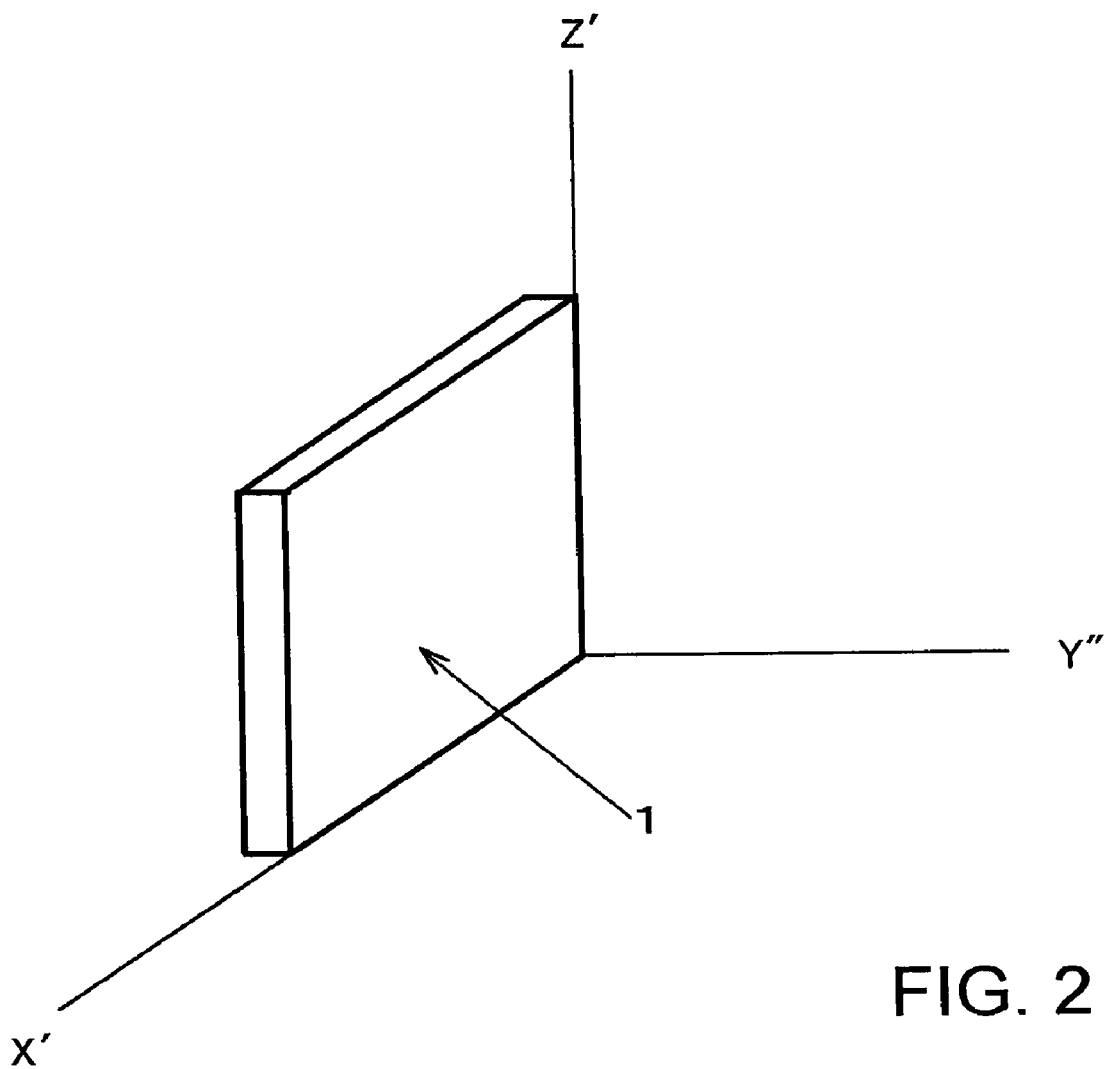
FIG. 2 is a view showing the relationship between the SC-cut crystal blank and an X'-axis, a Y"-axis and a Z'-axis.

The SC-cut crystal element uses crystal blank 1 which has a principal plane orthogonal to a Y"-axis, where the Y-axis is rotated twice with rotation angles (reference angles) α and β from the crystallographic X-axis and Z-axis of quartz being 22 degrees and 33 degrees, respectively, and resulting three axes are designated as an X'-axis, a Y"-axis, and a Z'-axis (see FIG. 2). Crystal blank 1 here is configured to have a square planar shape as well, so that diagonal lines which are inclined by an angle of γ from the Z'-axis and the X'-axis, respectively, are null stress-sensitivity axes Z'(γ) and X'(γ). Where γ is 8 degrees.

In this embodiment, one principal plane of crystal blank 1 which is an SC-cut plate is formed into a quadrangular pyramid like shape with its center point being the vertex. Specifically, there are formed triangular inclined surfaces of which bases are respective four sides of the crystal blank, and of which width is gradually increased from the vertex (or vertex potion) to each base, and ridge line portion P is formed between those inclined surfaces. In this case, the center point of the principal plane of crystal blank 1 corresponds to the point at which two null stress-sensitivity axes intersect at a right angle. Further, four triangular inclined surfaces in one principal plane of crystal blank 1 each have a convex curved shape of the same curvature in the direction orthogonal to peripheral sides (bases) of the crystal blank, and accordingly the ridge line portion is also formed into a curved shape. In crystal blank 1, the end faces at each position of four sides basically have the same thickness "t". The other principal plane of crystal blank 1 is processed to be a flat plane. That is, crystal blank 1 has a shape in which a quadrangular pyramid of which each side face is formed of a convex curved surface is placed on one principal plane of the base plate portion having a uniform thickness t.

Figure 8:
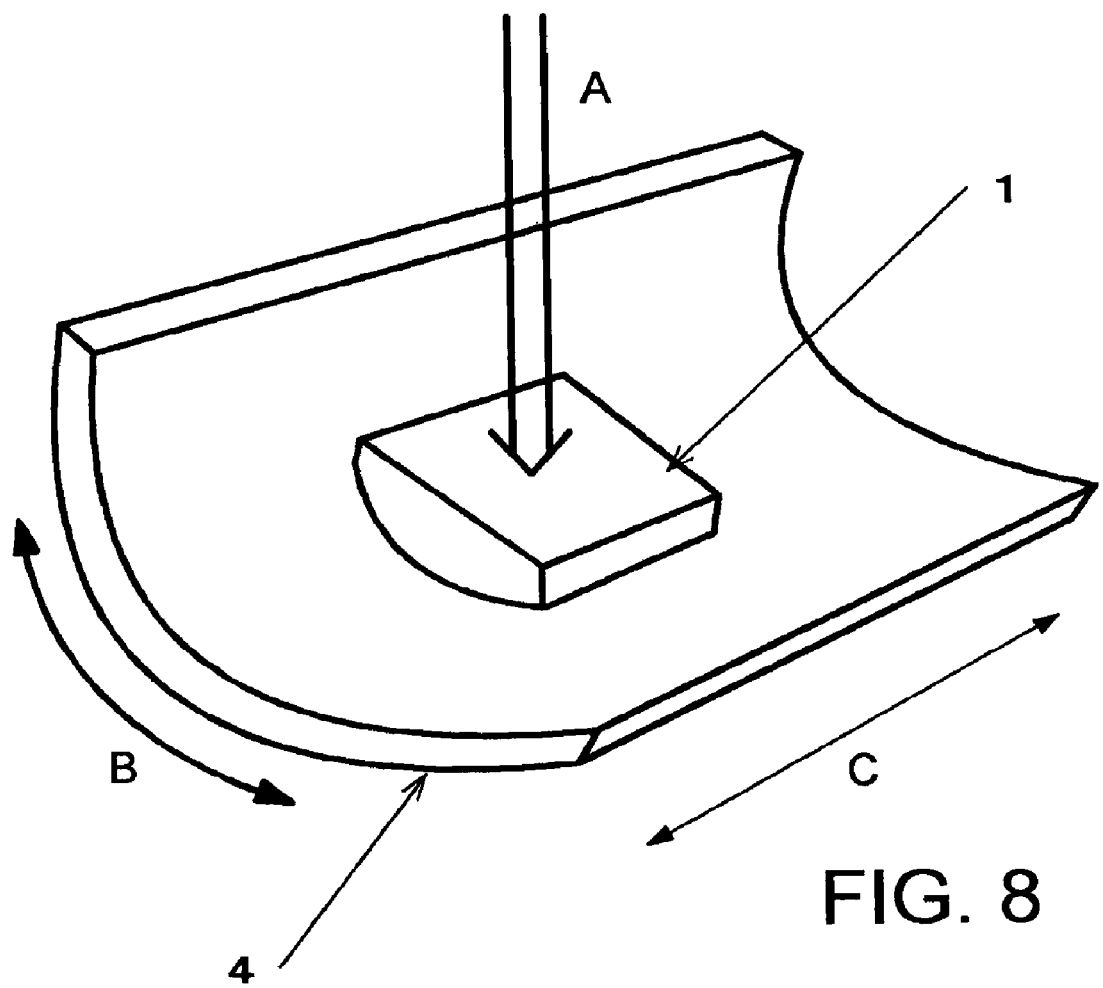
FIG. 8 a view illustrating a processing method for obtaining the crystal blank shown in FIG. 7.

Crystal blank 1 having such a shape can be processed by using grinding plate 4 formed into a half cylinder shape, for example, as shown in FIG. 8. First, a square crystal blank which is just cut out from a crystal of quartz and having an approximately uniform thickness is prepared, and one principal plane is brought into abutment with and pressed against the inner peripheral face of grinding plate 4 as shown by arrow A in the figure. At this moment, four sides of crystal blank 1 are arranged so as to be consistent with the directions of the width and length of grinding plate 4. Then, grinding plate 4 is pivoted in the width direction as shown in arrow B while one principal plane of crystal blank is pressed against grinding plate 4, and is further moved back and forth in length direction C.

Such relative movement between grinding plate 4 and crystal blank 1 makes one principal plane of crystal blank 1 to be processed into a convex curved surface along the inner periphery of grinding plate 4, and this convex curved surface linearly extends in the shown direction C. At this moment, grinding is performed such that constant thickness t of the crystal blank is remained in the end faces of crystal blank 1 along the direction C. Next, crystal blank 1 is rotated by 90 degrees and is similarly ground such that the thickness t is remained.

Thus, through such curved surface grinding in the direction along orthogonal two sides of the square, crystal blank 1 will be processed into a quadrangular pyramid like shape of which vertex is the center part of one principal plane of crystal blank 1 and which has an inclined surface of isosceles triangle on each four faces as shown in FIG. 7. In this case, each inclined surface is configured to be a convex curved surface having a curvature which imitates the inner periphery of grinding plate 4 from the vertex portion toward each side of the crystal blank. Although ridge line portion P is also formed into a convex curve, its curve is gentler than the curvature of grinding plate 4.

Figure 3A:
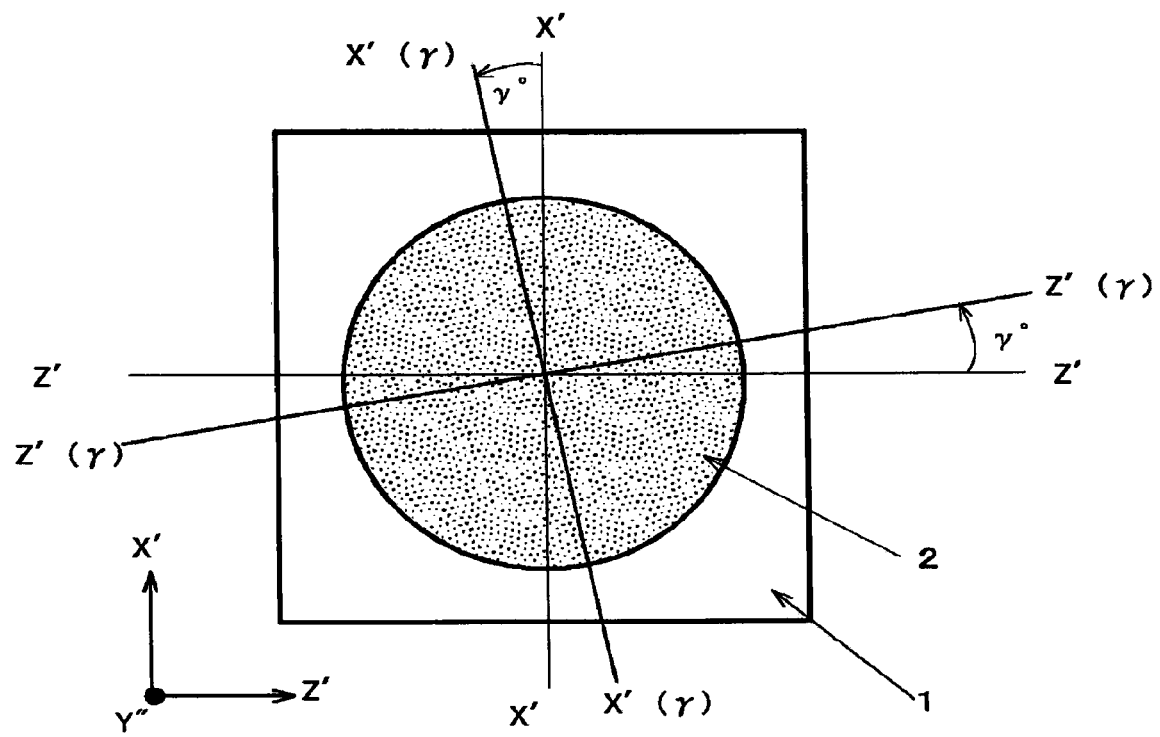
FIGS. 3A and 3B are a plan view and a sectional view, respectively, showing the basic configuration of a conventional SC-cut crystal element.
Figure 3B:
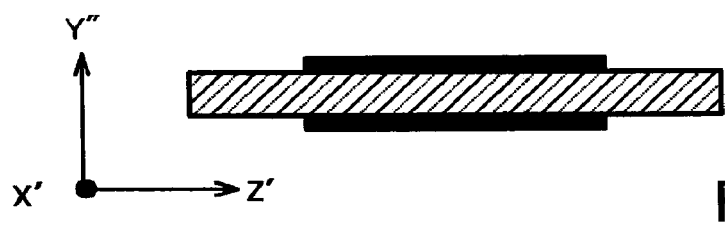
Figure 4:
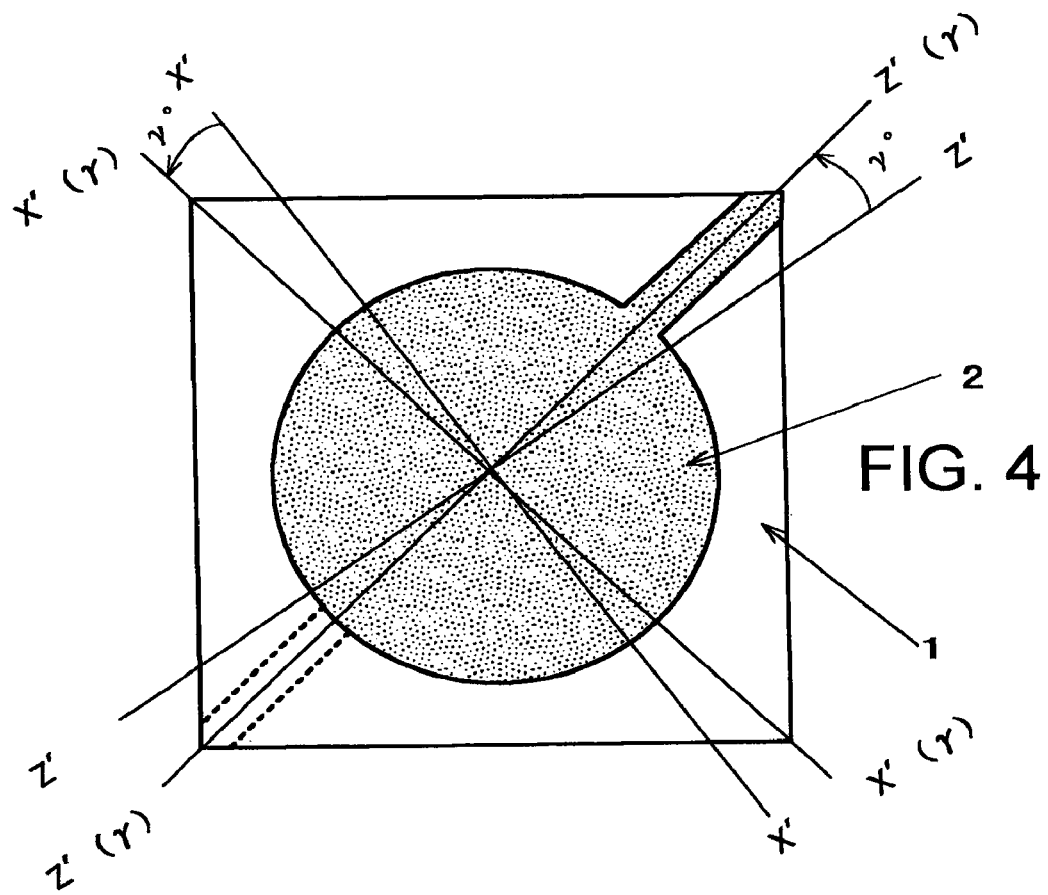
FIG. 4 is a plan view showing an example of a conventional SC-cut crystal element.
Figure 5:
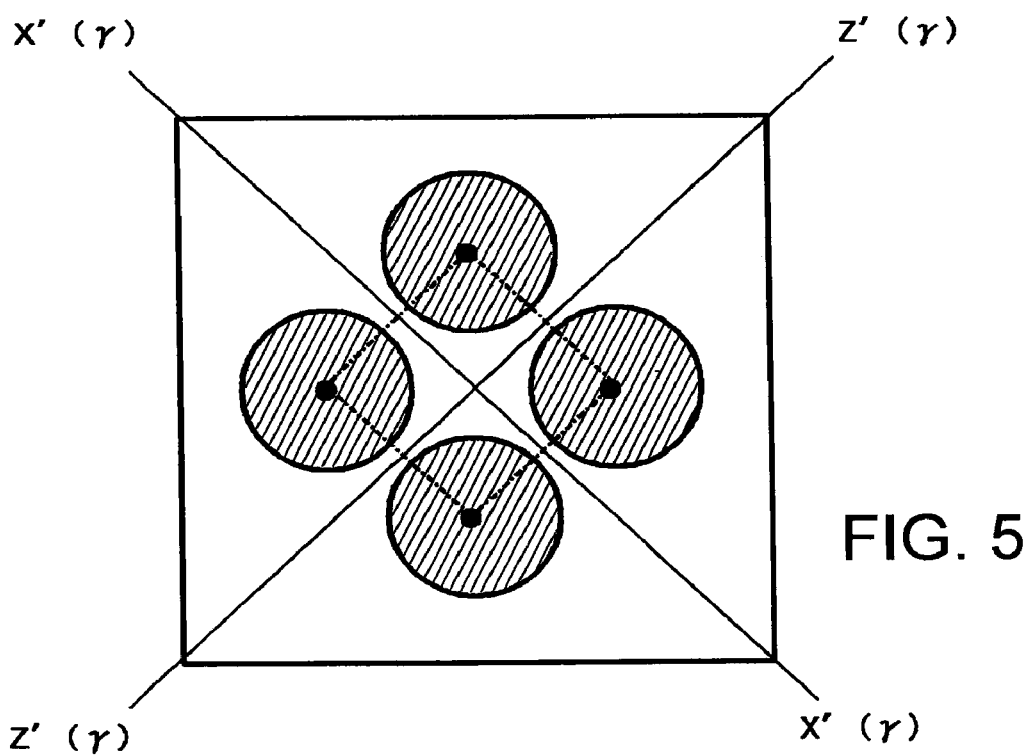
FIG. 5 is a plan view showing a vibration displacement distribution in an SC-cut crystal element.
Figure 6:
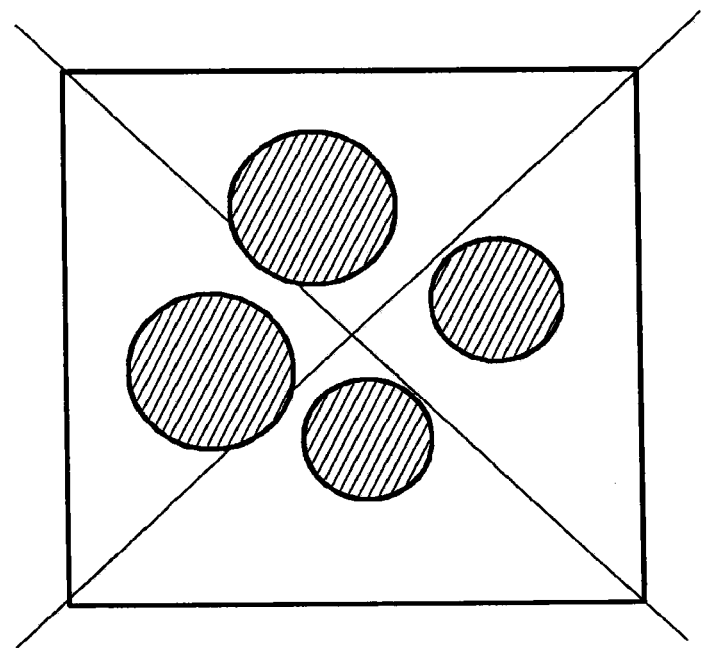
FIG. 6 is a plan view showing an SC-cut crystal element having an asymmetric vibration displacement distribution.

Thereafter, the above described excitation electrodes 2 and leader electrodes 3 are formed in both principal planes of crystal blank 1. In this case as well, as shown in FIG. 3, each excitation electrode 2 is provided in a circular shape, and leader electrodes 3 are extended from excitation electrodes 2 toward both ends of the diagonal part which is one null stress-sensitivity axis Z'(γ). The SC-cut crystal element formed with-excitation electrodes 2 and leader electrodes 3 as described above is held at two points by holding both ends of the diagonal line which is one null stress-sensitivity axis Z'(γ), or is held at four points by holding both ends of the diagonal lines corresponding to both null stress-sensitivity axes X'(γ) and Z'(γ) and is hermetically encapsulated in a package for crystal element. Thus a crystal unit is completed.

Figure 9A:
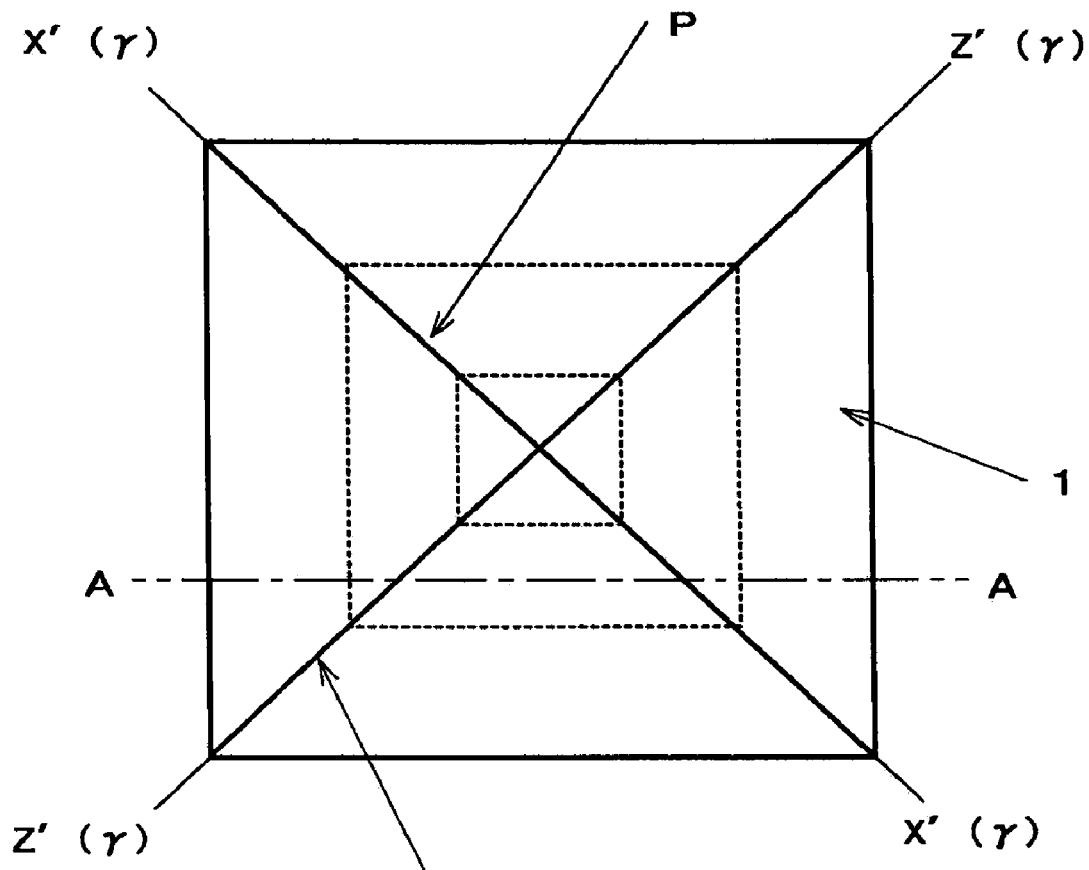
FIGS. 9A and 9B are a plan view and an A-A line sectional view, respectively, showing the operation principle of the SC-cut crystal element of the first embodiment.
Figure 9B:

FIG. 9A is a plan view of crystal blank 1 described above and the dashed line in the figure is the line to show the contour, that is the positions at which the thickness of crystal blank 1 is a certain fixed value. In this way, on one of principal planes of crystal blank 1, the section thickness in the vertical direction is the same on the sides of the square for each square concentrically positioned with respect to the center point of the crystal blank. Therefore, the vertical section of the crystal blank on the line parallel with each side of crystal blank 1 is as shown FIG. 9B. FIG. 9B is a sectional view of crystal blank 1 taken along line A-A of FIG. 9A. That is, sectional thickness in the width direction across the each inclined surface of triangular shape on one principal plane of crystal blank 1 will be the same. The thickness becomes gradually smaller on an adjacent inclined surface bounded by ridge line portion P. Therefore, the section taken along A-A line becomes a so-called bevel shape, in which the thickness in the central region is large, and both sides bounded by ridge line portions P are inclined thereby decreasing the thickness.

Figure 10:
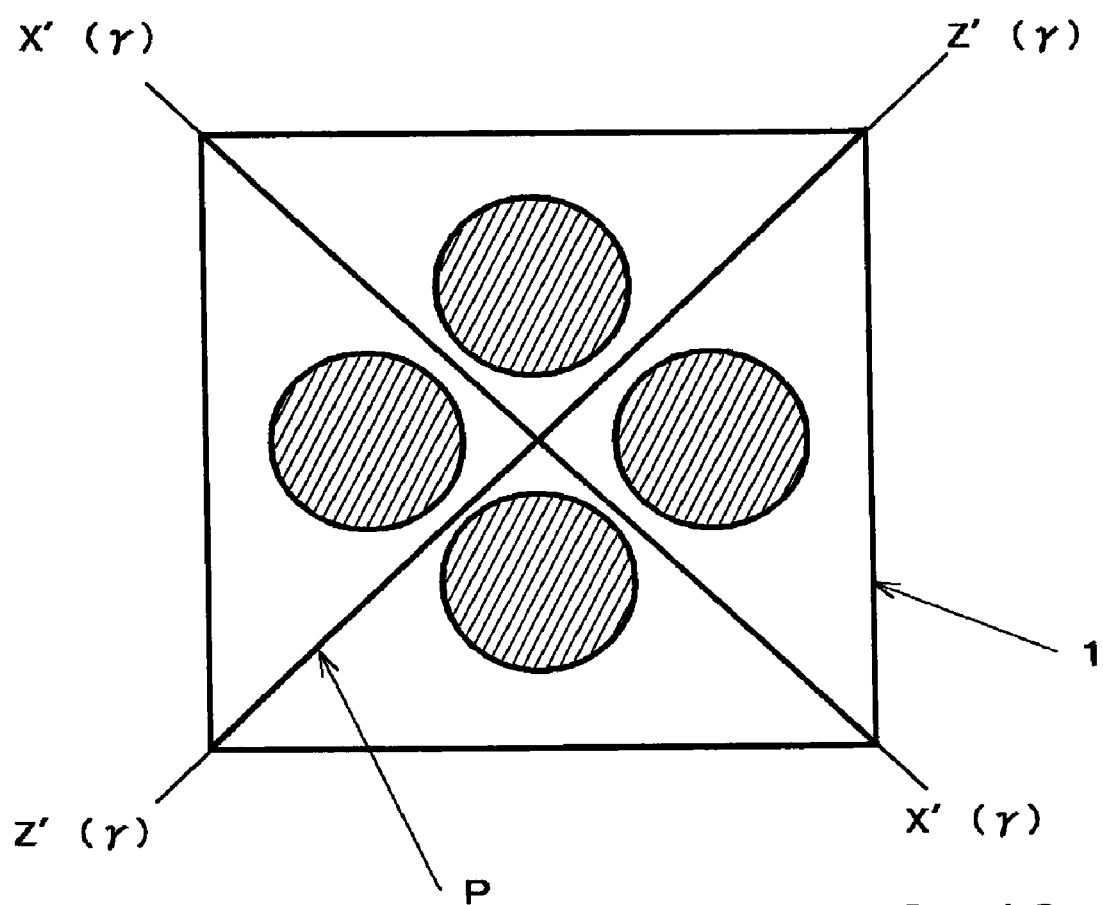
FIG. 10 is a plan view showing the vibration displacement distribution in the SC-cut crystal element of the first embodiment.

In the present embodiment, each ridge line P corresponds to mutually orthogonal null stress-sensitivity axes Z'(γ) and X'(γ) of crystal blank 1. The region which exhibits emphasized vibration displacement, and which is separated by null stress-sensitivity axes Z'(γ) and X'(γ), takes place on each of four inclined surfaces. Further, since in the region in which vibration displacement is emphasized in each inclined surface, the section on the line parallel with each outer periphery of each inclined surface is formed into a bevel shape, the vibration energy (vibration displacement) therein is forcibly confined. In other words, in this configuration, ridge line P in one principal plane of crystal blank 1 becomes a boundary condition when increasing the thickness of the central region and gradually decreasing the sectional thickness on both sides in each section. Therefore, as shown in FIG. 10, emphasized vibration displacement is confined in the four portions which are between ridge line portions P and the separation of the positions of the four vibration displacement regions becomes clear.

In the present embodiment, the region in which vibration displacement is emphasized will be confined into sections divided by ridge line portion P. Even if there is an error in the cutting orientation when cutting out an SC-cut plate, or there is a deviation in the cutting angle within a plane when forming a square crystal blank such that the diagonal direction corresponds to null stress-sensitivity axes Z'(γ) and X'(γ), or there is deviation in the holding position of the crystal blank caused by the deviation in the cutting angle, it is possible to maintain the frequency-temperature characteristics depending on vibration displacement distribution and the vibration characteristics such as CI etc. of the crystal element in a good state. According to the present embodiment, it becomes easy to design and manufacture a crystal element of which vibration characteristics is well maintained.

Figure 11A:
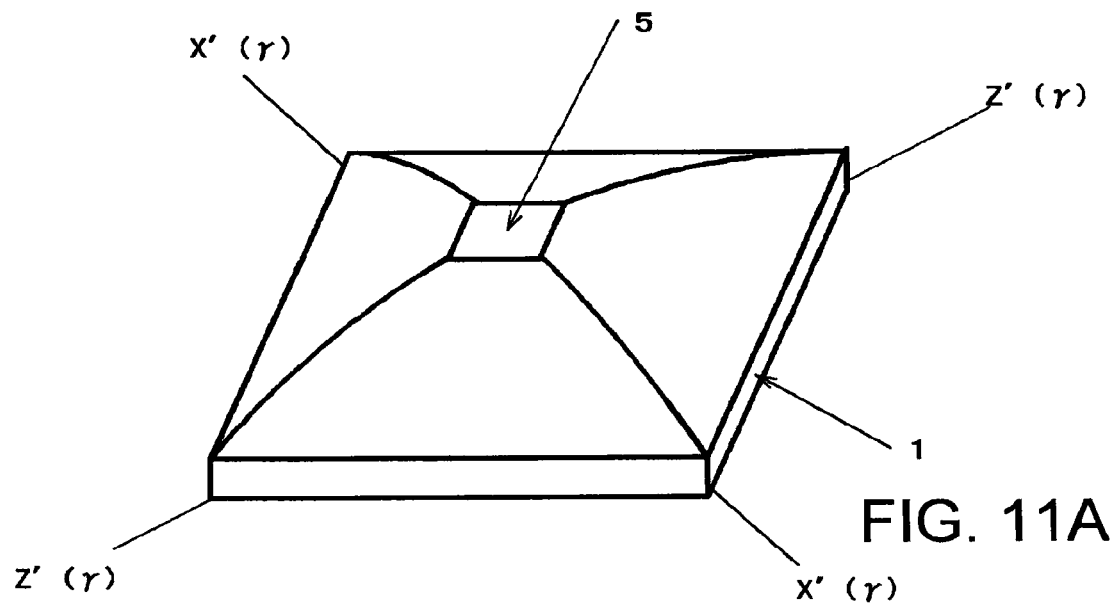
FIGS. 11 and 11B are perspective views showing other examples of the crystal blank which can be used in the SC-cut crystal element of the first embodiment.
Figure 11B:
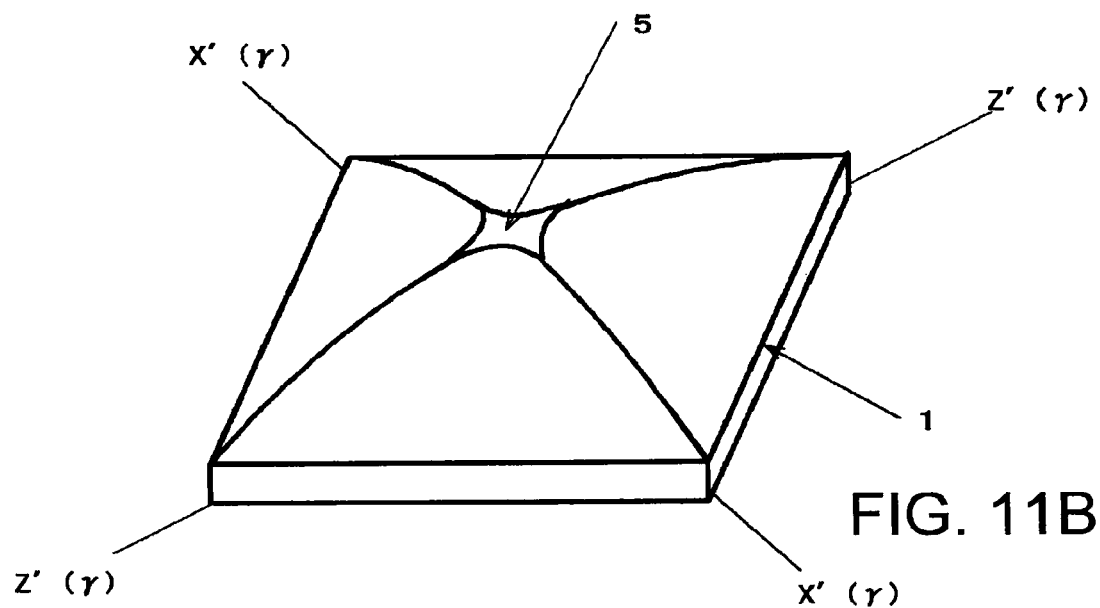

It is noted that in the first embodiment, one principal plane of crystal blank 1 is processed in a quadrangular pyramid like shape of which center part is the vertex or apex, and further the vertex portion of the quadrangular pyramid may be processed into a flat surface shape as shown in FIGS. 11A and 11B. A flat surface shape is a fully flat plane or a convex curved surface with a small curvature. Such flat surface may be formed by bringing the center part of one principal plane of crystal blank 1 in abutment with a grinding plate (not shown) having a planer surface or a spherical surface with a small curvature after the processing to form a quadrangular pyramid like shape. By these processing, vertex portion 5 of crystal blank 1 is processed into a planer surface in the case shown in FIG. 11A, and vertex portion 5 is processed into a spherical surface shape with a small curvature in the case shown in FIG. 11B. In the case shown in FIG. 11B, the curvature of vertex portion 5 may be smaller than the curvature of the inclined surface of the quadrangular pyramid. Thus, by making vertex portion 5 to be a flat surface shape, it becomes possible to adjust the asymmetry in mass for the vertex which is caused when processing one principal plane of the crystal blank into a quadrangular pyramid like shape, thus further improving the vibration characteristics of the crystal element.

Further, by processing one principal plane of crystal blank 1 into a quadrangular pyramid like shape with the thickness of crystal blank 1 being slightly larger than the thickness corresponding to a standard value for target frequency, and thereafter processing vertex portion 5 of the quadrangular pyramid to be a flat surface shape thereby decreasing the thickness of crystal blank 1, it is possible to adjust the vibration frequency of crystal blank 1 in a range of the standard value of the target frequency. Such adjustment of vibration frequency may be performed in a similar fashion in a second embodiment described later.

Figure 12A:
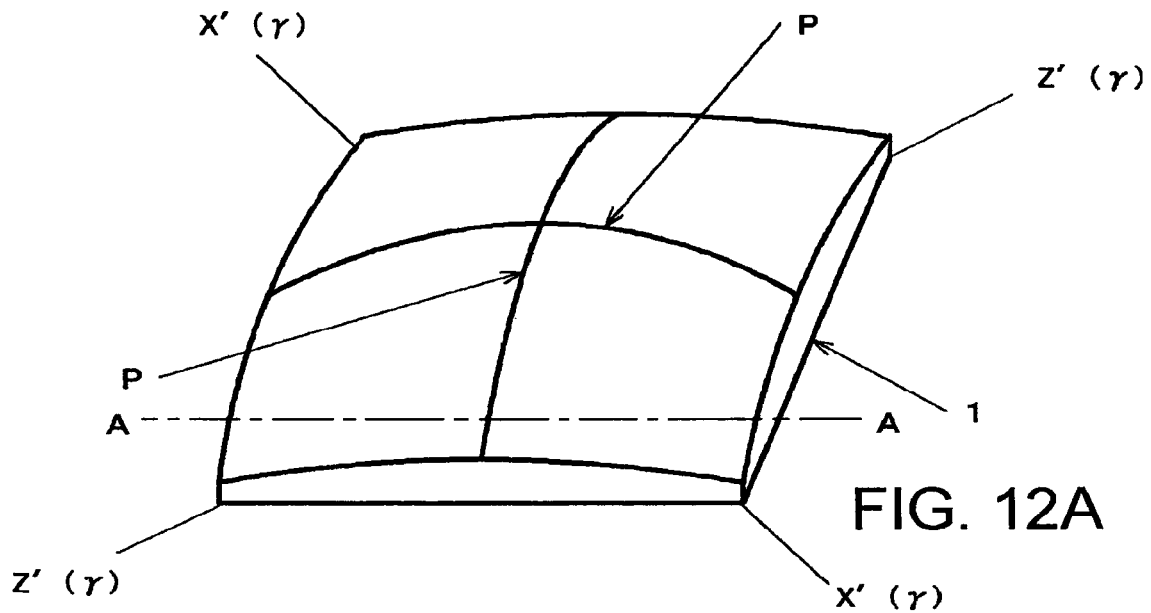
FIG. 12A is a perspective view showing a crystal blank used in the SC-cut crystal element according to a second embodiment of the present invention.

FIG. 12A shows a crystal element made of a double-rotation Y-cut plate according to a second embodiment of the present invention. Here, description will be made on the case in which the double-rotation Y-cut plate is an SC-cut plate. FIG. 12A shows a crystal blank in such SC-cut crystal element. In the figure, like components as in the above described each figure are given like reference symbols, thereby simplifying or omitting redundant description.

In the first embodiment described above, ridge line portion P is provided so as to extend in the diagonal direction in the first principal plane of crystal blank 1 having a square planer shape. In contrast, in the second embodiment, ridge line portion P is configured to be the line connecting middle points of opposing sides of a pair for each of the two pairs of opposing sides of crystal blank 1. That is, ridge line P is provided in a cross shape so as to connect the middle point of each side of the outer periphery of crystal blank 1. When forming by using, for example, grinding plate 4 of a half cylinder shape as shown in FIG. 8, such crystal blank 1 may be ground such that the diagonal direction of crystal blank 1 is oriented in the length direction of grinding plate 4, in contrast to the case of the first embodiment. In this case as well, it is configured such that each diagonal direction of the crystal blank is mutually orthogonal null stress-sensitivity axes Z'(γ) and X'(γ).

Figure 12B:
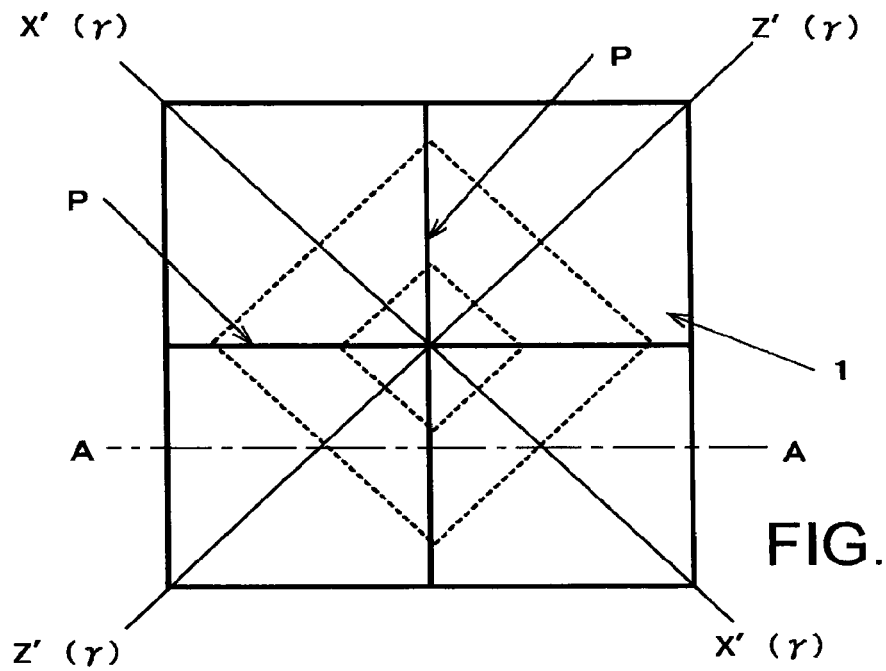
FIGS. 12B and 12C are a plan view and an A-A line sectional view, respectively, showing the SC-cut crystal element of the second embodiment.
Figure 12C:
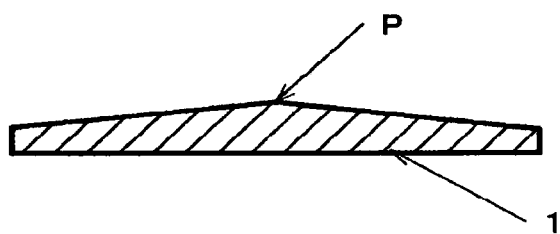

FIG. 12B is a plan view of crystal blank 1 in the second embodiment, and the dash line in the figure represents a contour. FIG. 12C is a sectional view of crystal blank 1 taken along A-A line in FIG. 12B. In the case of the second embodiment, the positions at which the thickness becomes same in crystal blank 1 are the sides of a square interconnecting four points at an equal distance from the intersection on this ridge line P, when considering the intersection of two ridge lines P. The sides of this square can be considered to be bases of the quadrangular pyramid having a vertex at the intersection of ridge lines P. The section along the line parallel with each side of crystal blank, for example, the section taken along A-A line becomes an inclined surface of which center point in the width direction is ridge line P, and of which thickness is maximum at ridge line P and gradually becomes smaller toward both sides.

In the second embodiment as well, as with the case of the first embodiment, the vibration displacement of four regions between mutually orthogonal null stress-sensitivity axes Z'(γ) and X'(γ) in the central region of crystal blank 1 will be confined into the region having a large thickness in crystal blank 1 on the center line interconnecting the middle points of opposing sides of each pair. Therefore, by the second embodiment as well, even if there is some angle deviation in the cutting orientation and planar cutting in the SC-cut crystal blank, it is possible to maintain the vibration characteristics of crystal element well. Further, it is possible to easily design and manufacture such a crystal element.

Figure 13:
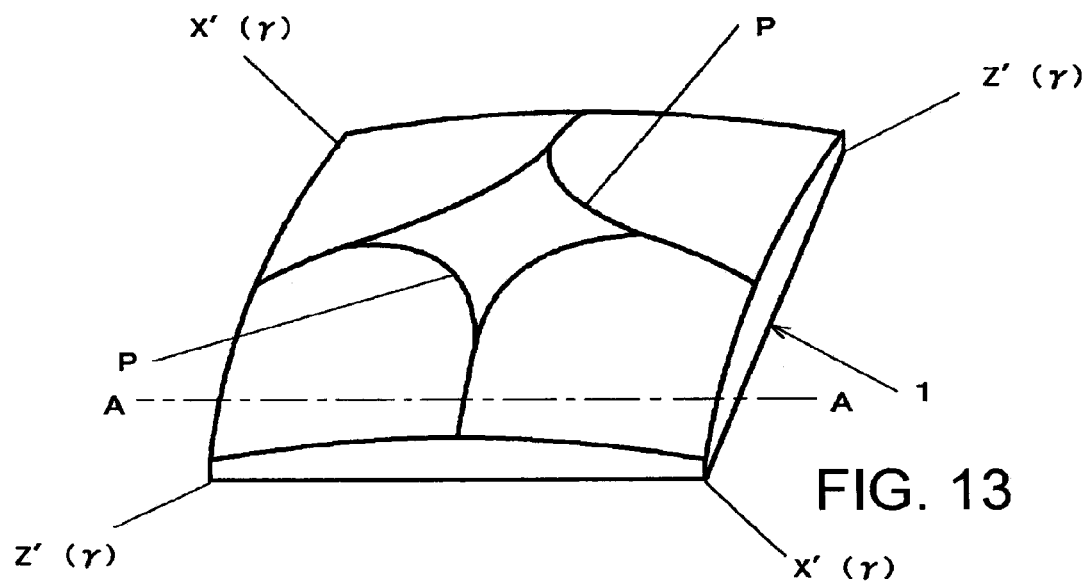
FIG. 13 is a perspective view showing show another example of the crystal blank which can be used in the SC-cut crystal element of the second embodiment.

In the second embodiment as well, as shown in FIG. 13, it is possible to finish ridge line portion P in a convex curved shape with a small curvature in the center part of one principal plane of crystal blank 1. For example, only the region of ridge line P in the center part may be ground to form a region with a smaller curvature by rotating crystal blank 1 by a grinding plate which is configured to be a sphere shape with a curvature not more than the curvature along ridge line P in the direction across the center of crystal blank 1.

Further, with any processing means, it is also possible to make only the intersection region of ridge lines to be a curved shape. As a result of these, it is possible to make a smooth ridge line, at which adjacent inclined surfaces of a quadrangular pyramid like shape intersect thereby forming a boundary, and to confine vibration into a region of large thickness, as well as to easily generate vibration since the boundary condition for vibration is removed.

Although, in the above described first and second embodiments, it has been supposed that crystal blank 1 has a square planar shape, and its diagonal directions are null stress-sensitivity axes Z'(γ) and X'(γ), null stress-sensitivity axes Z'(γ) and X'(γ) may be in the direction along each side of the square. In that case, the crystal blank is held at middle points of opposing sides, so that those points become both ends of null stress-sensitivity axes Z'(γ) and X'(γ).

Figure 14:
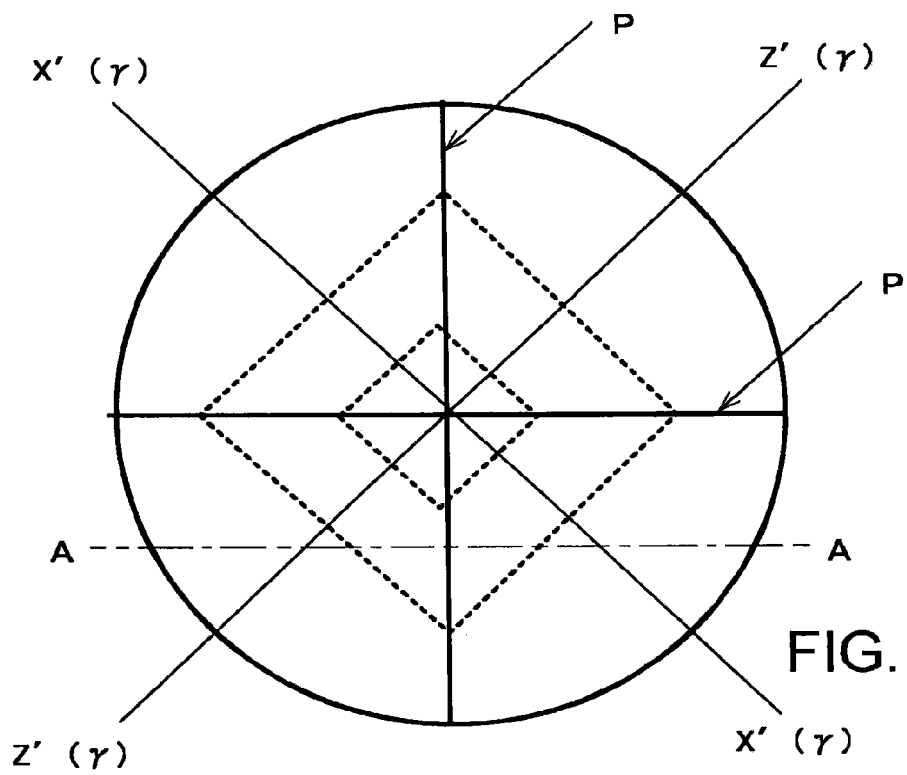
FIG. 14 is a plan view showing an example of crystal blank which can be used in the crystal element of another embodiment of the present invention.

Further in the present invention, the shape of crystal blank 1 is not limited to a square. The crystal blank to which the present invention is applied may be a circular crystal blank for example as shown in FIG. 14, or a rectangular crystal blank which is not shown though. Even in these case, when considering a line (for example, A-A line) orthogonal to ridge line P, corresponding to the vertex of the quadrangular pyramid like shape, the sectional thickness of crystal blank 1 is larger in the central region, that is, at the position of ridge line P and becomes smaller toward both ends, along this line.

The double-rotation Y-cut plate to which the present invention is applied is not limited to the SC-cut plate. For example, the preset invention can be similarly applied to an IT-cut quartz plate with the above described angle a being 34 degrees and angle β being 19 degrees. It is noted that the direction of null stress-sensitivity axis in an IT-cut plate is, as with an SC-cut plate, the direction rotated by 8 degrees from Z'-axis and the direction orthogonal to this direction, that is the direction rotated by 8 degrees from the X'-axis. Further, the present invention may be applied to others, besides the SC-cut plate and the IT-cut plate, if they are a double-rotation Y-cut plate having a similar vibration displacement distribution.

What is claimed is:

1. A crystal element made of a double-rotation Y-cut plate, said crystal element comprising a crystal blank which is cut from a crystal of quartz, a principle plane of the crystal blank being orthogonal to a Y''-axis, where a Y-axis and a Z-axis are rotated by an angle of α centering around an X-axis in the crystal of quartz to be designated as a Y'-axis and a Z'-axis, and the X-axis and the Y'-axis are rotated by an angle of β centering around the Z'-axis to be designated as an X'-axis and said Y''-axis, wherein said crystal blank has mutually orthogonal two null stress-sensitivity axes and has emphasized vibration displacement in four regions radially divided from a center at which said null stress-sensitivity axes mutually intersect at a right angle, wherein a thickness of a center part at which said null stress-sensitivity axes mutually intersect at a right angle is increased, and a ridge line portion defining a quadrangular pyramid like shape from said center part toward an outer peripheral part of said crystal blank is formed, and wherein when a base opposing to a vertex angle of said quadrangular pyramid like shape is provided, a sectional thickness of said crystal blank along said base is larger in the central region of said crystal blank and becomes gradually smaller toward both ends of said crystal blank.

2. The crystal element according to claim 1, wherein each of both principal planes of said crystal blank is provided with an excitation electrode.

3. The crystal element according to claim 1, wherein said ridge line portion of said crystal blank is along said mutually orthogonal null stress-sensitivity axes.

4. The crystal element according to claim 1, wherein said ridge line portion of said crystal blank is along a stress-sensitivity middle axis which is rotated by 45 degrees respectively viewed from the center of said mutually orthogonal null stress-sensitivity axes to bisect a space between said null stress-sensitivity axes.

5. The crystal element according to claim 3, wherein said crystal blank has a square planar shape, and said mutually orthogonal null stress-sensitivity axes are laid in diagonal directions of said square.

6. The crystal element according to claim 1, wherein a vertex portion of said quadrangular pyramid in one principal plane of said crystal blank is formed into a flat surface shape which has at least a gentler inclination than that of the inclined surface of said quadrangular pyramid.

7. The crystal element according to claim 1, which is configured as an SC-cut crystal element with said angle α being 33 degrees and said angle β being 22 degrees.

8. The crystal element according to claim 7, wherein said crystal blank has mutually orthogonal null stress-sensitivity axes which are inclined by 8 degrees form said Z'-axis and said X'-axis.

9. The crystal element according to claim 1, which is configured as an IT-cut crystal element with said angle α being 34 degrees and said angle β being 19 degrees.

10. The crystal element according to claim 9, wherein said crystal blank has mutually orthogonal null stress-sensitivity axes which are inclined by 8 degrees from said Z'-axis and said X'-axis.

* * * * *